(12) United States Patent
Peters et al.

(10) Patent No.: US 11,460,778 B2
(45) Date of Patent: Oct. 4, 2022

(54) PHOTORESIST STRIPPER

(71) Applicant: Versum Materials US, LLC, Tempe, AZ (US)

(72) Inventors: Richard Dalton Peters, Tempe, AZ (US); Yuanmei Cao, Tempe, AZ (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 51 days.

(21) Appl. No.: 16/365,506

(22) Filed: Mar. 26, 2019

(65) Prior Publication Data

US 2019/0317409 A1 Oct. 17, 2019

Related U.S. Application Data

(60) Provisional application No. 62/656,843, filed on Apr. 12, 2018.

(51) Int. Cl.
| | |
|---|---|
| *G03F 7/42* | (2006.01) |
| *C11D 7/06* | (2006.01) |
| *C11D 7/26* | (2006.01) |
| *C11D 7/32* | (2006.01) |
| *C11D 7/50* | (2006.01) |
| *C11D 11/00* | (2006.01) |

(52) U.S. Cl.
CPC ............... *G03F 7/425* (2013.01); *C11D 7/06* (2013.01); *C11D 7/261* (2013.01); *C11D 7/3209* (2013.01); *C11D 7/3218* (2013.01); *C11D 7/3227* (2013.01); *C11D 7/5022* (2013.01); *C11D 11/0047* (2013.01)

(58) Field of Classification Search
CPC ........... G03F 7/425; C11D 7/06; C11D 7/261; C11D 7/3209; C11D 7/3218; C11D 7/3227; C11D 7/5022; C11D 11/0047; H01L 21/31133
See application file for complete search history.

(56) References Cited

U.S. PATENT DOCUMENTS

| | | | | |
|---|---|---|---|---|
| 3,269,861 A | * | 8/1966 | Schneble, Jr. | ........ C23C 18/405 216/18 |
| 3,356,694 A | * | 12/1967 | Lunn | ........... C07J 5/00 540/12 |
| 3,856,694 A | * | 12/1974 | Becking | ............. C23F 1/44 216/108 |
| 5,415,811 A | * | 5/1995 | Wile et al. | ............... C07C 51/54 252/546 |
| 5,962,197 A | * | 10/1999 | Chen | ........ C11D 3/044 134/38 |
| 6,465,403 B1 | * | 10/2002 | Skee | ............ C11D 3/044 510/175 |
| 9,158,202 B2 | * | 10/2015 | Peters | ................... C11D 7/3281 |
| 10,072,237 B2 | * | 9/2018 | Chang | ........................ C11D 7/34 |
| 10,073,351 B2 | * | 9/2018 | Agarwal | ................... G03F 7/426 |
| 10,948,826 B2 | * | 3/2021 | Cao | ........................ G03F 7/425 |
| 11,353,794 B2 | * | 6/2022 | Peters | .................... G03F 7/426 |
| 2001/0014656 A1 | * | 8/2001 | Smith | ....................... C11D 3/10 510/276 |
| 2006/0094613 A1 | * | 5/2006 | Lee | .................... H01L 21/31133 510/175 |
| 2009/0036344 A1 | * | 2/2009 | Pollard | ................... G03F 7/423 510/176 |
| 2010/0043823 A1 | * | 2/2010 | Lee | .................... H01L 21/31111 134/1.3 |
| 2010/0159400 A1 | * | 6/2010 | Hong | ....................... G03F 7/425 430/322 |
| 2011/0171789 A1 | * | 7/2011 | Korgel | .............. H01L 29/42332 556/400 |
| 2013/0116159 A1 | | 5/2013 | Pollard et al. | |
| 2014/0100151 A1 | | 4/2014 | Egbe et al. | |
| 2014/0142017 A1 | * | 5/2014 | Peters | ................... C11D 7/3263 510/176 |
| 2016/0152930 A1 | * | 6/2016 | Egbe | ....................... G03F 7/425 510/176 |
| 2019/0101830 A1 | * | 4/2019 | Ge | ..................... H01L 21/31133 |
| 2019/0196337 A1 | * | 6/2019 | Peters | .................... C11D 3/048 |
| 2019/0278184 A1 | * | 9/2019 | Cao | ................... H01L 21/31133 |
| 2019/0317409 A1 | * | 10/2019 | Peters | .................. C11D 7/3218 |

FOREIGN PATENT DOCUMENTS

| | | |
|---|---|---|
| CN | 102478768 A | 5/2012 |
| CN | 102540774 A | 7/2012 |
| CN | 103389627 A | 11/2013 |
| JP | 2014078009 A | 1/2014 |
| JP | 2015079163 A | 4/2015 |
| KR | 20040098751 A | 11/2004 |
| KR | 20080028739 A | 4/2008 |
| WO | 2015056428 A1 | 4/2015 |

OTHER PUBLICATIONS

Copper(II) nitrate, 2.5-hydrate MSDS ThermoFischer, Jun. 2014 pp. 1-8. (Year: 2014).*

"Surface Treatment Technology for Metal Corrosion Layer Focusing on Copper Alloy" J. of Korean Oil Chemists' Soc., vol. 31, No. 2. Jun. 2014. 176-18 (Year: 2014).*

(Continued)

*Primary Examiner* — Gregory R Delcotto
*Assistant Examiner* — Preeti Kumar
(74) *Attorney, Agent, or Firm* — William T. Slaven, IV

(57) ABSTRACT

Improved stripper solutions for removing photoresists from substrates are provided that exhibit improved compatibility with copper, leadfree solder, and epoxy-based molding compounds. The stripper solutions comprise a primary solvent, a secondary glycol ether solvent, potassium hydroxide, and an amine. The solutions also exhibit reduced potassium carbonate crystal formation compared to conventional formulations containing potassium hydroxide, and extended bath life compared to formulations containing tetramethylammonium hydroxide.

22 Claims, No Drawings

OTHER PUBLICATIONS

Copper II nitrate hemi pentahydrate MSDS from https://pubchem.ncbi.nlm.nih.gov/compound/Copper-II-nitrate-hemipentahydrate (Year: 2022).*

* cited by examiner

PHOTORESIST STRIPPER

CROSS-REFERENCE TO RELATED APPLICATIONS

This application claims priority to U.S. provisional application 62/656,843 filed on Apr. 12, 2018, the entire contents of which is incorporated herein by reference thereto for all allowable purposes.

BACKGROUND OF THE INVENTION

The present invention relates generally to compositions having the ability to effectively remove photoresists from substrates, and to methods for using such compositions. The compositions disclosed are stripper solutions for the removal of photoresists that may be essentially free of DMSO and/or NMP, and/or TMAH, and preferably have compatibility with copper, leadfree SnAg solder, and epoxy-based molding compound.

Photoresist strippers for removal of thick photoresists used in wafer level packaging typically are comprised of different combinations of solvents, amines, quaternary ammonium hydroxides, inorganic hydroxides, co-solvents, corrosion inhibitors, and other additives. Many products for this application include DMSO or NMP as the solvent plus amines or quaternary ammonium hydroxides or both. Tetramethylammonium hydroxide (TMAH) is the most commonly used quaternary ammonium hydroxide due to its lower cost and better performance than other quaternary ammonium hydroxides. However, there are well known potential health effects associated with TMAH. An alternative to TMAH containing stripper compositions is desirable.

Potassium hydroxide (KOH) is an inorganic strong base that provides advantageous properties when used in photoresist strippers, without the potential health effects associated with TMAH. KOH is low cost and has good thermal stability, leading to photoresist strippers with longer bath lifetimes typically than photoresist strippers using TMAH. One issue associated with KOH is that it reacts with carbon dioxide from the atmosphere to produce potassium carbonate. Potassium carbonate is water soluble, but typically not very soluble in organic solvents. Photoresist strippers using KOH typically have precipitation issues with potassium carbonate crystals. The removal of the crystals may require extra cleaning of process tools, using water to dissolve and/or rinse them away.

BRIEF SUMMARY OF THE INVENTION

In one aspect of the present invention there are provided photoresist stripper solutions for effectively removing or stripping a positive or negative photoresist, photoresist after an etch process, or etch residue from a substrate. The inventive stripper solutions have particularly high loading capacities for the resist material, and the ability to remain a liquid when subjected to temperatures below normal room temperature that are typically encountered in transit, warehousing and in use in some manufacturing facilities.

The compositions provide KOH photoresist stripper compositions exhibiting reduced potassium carbonate crystal formation and extended bath life. The compositions are additionally free of sulfur containing solvents and exhibit improved compatibility with copper, leadfree solder, and epoxy-based molding compounds.

The compositions according to this present disclosure typically include a primary glycol ether solvent, an inorganic base, a secondary glycol ether solvent that is different than the primary solvent, an amine, and a corrosion inhibitor. Suitable glycol ether solvents include diethylene glycol butyl ether (DB), diethylene glycol ethyl ether (DE), diethylene glycol methyl ethyl ether (DME), 3-methoxy-3-methyl-1-butanol (MMB), and/or diethylene glycol (DEG). Suitable inorganic bases include potassium hydroxide (KOH), lithium hydroxide (LiOH) and/or sodium hydroxide (NaOH). Suitable amines include monoethanolamine (MEA), diethanolamine (DEA), triethanolamine (TEA), diethylenetriamine (DETA), triethylenetetramine (TETA), and/or 2-(2-aminoethoxy)ethanol (AEE). The composition is essentially free of DMSO, NMP, and TMAH. A further embodiment according to this present disclosure contains an additional or tertiary solvent that is different than both the primary and secondary solvents. Suitable tertiary solvents include glycol ethers, polyhydroxyl compounds (such as, glycols, triols, etc.), and the like.

Another embodiment according to this present disclosure contains DB, a secondary glycol ether solvent, an inorganic base, such as potassium hydroxide (KOH), an amine, and corrosion inhibitor. This embodiment is essentially free of a tertiary glycol ether solvent, DMSO, NMP, and TMAH.

Another embodiment according to this present disclosure contains DE, a secondary glycol ether solvent, an inorganic base, such as potassium hydroxide (KOH), and corrosion inhibitor. This embodiment is essentially free of a tertiary glycol ether solvent, DMSO, NMP, and TMAH.

A second aspect of the present disclosure provides for methods of using the novel stripper solutions described above to remove photoresist and related polymeric materials from a substrate. A photoresist can be removed from a selected substrate having a photoresist thereon by contacting the substrate with a stripping solution for a time sufficient to remove the desired amount of photoresist, by removing the substrate from the stripping solution, rinsing the stripping solution from the substrate with DI water or a solvent, and drying the substrate.

A third aspect of the present disclosure includes electronic devices manufactured by the novel method disclosed.

Other features and advantages of the present invention will be apparent from the following more detailed description, taken in conjunction with the accompanying drawings which illustrate, by way of example, the principles of the invention.

The embodiments of this invention provides one or more of the following benefits: low precipitation of solids during use; the compositions have the ability to remain liquid at temperatures below normal room temperature and temperatures frequently encountered in transit and warehousing, and have flashpoints well above normal processing temperatures, a photoresist stripper with good cleaning-ability, high loading capacity, reduced crystallization and precipitation of potassium carbonate, or other alkali metal compounds, even when the stripper solution of this invention comprised an alkali metal hydroxide, compatibility with copper, leadfree SnAg solder and epoxy-based molding compounds as well as extended bath life.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, that is, "one or more than one," unless otherwise indicated herein or clearly contradicted by the context. The terms "comprising," "having," "including," and "containing" and their respective conjugates are to be construed as open-ended terms (i.e., meaning "including, but not limited to,") unless otherwise noted, but also include the partially closed or closed terms of "consisting essentially of" and "consisting of". Recitation of ranges of values herein are merely intended to serve as a shorthand method of referring individually to each separate value falling within the range, unless otherwise indicated herein, and each separate value is incorporated into the specification as if it were individually recited herein, and any value reported herein can be used, in any combination, as the beginning or end of a range for the aspect for which it is described. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. All percentages are weight percentages and all weight percentages are based on the total weight of the composition (prior to any optional concentration and/or dilution thereof). All of the weight percentages of the components described herein, including the examples, are based on neat components, that is, water-free components added to the compositions of the invention. Every use of "one or more" means and can be substituted with "one or more than one" everywhere it appears. Additionally, "one or more" can also be substituted with "two or more than two" or "three or more than three" or "four or more than four" and so on.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

For the purposes of promoting an understanding of what is claimed, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

The compositions according to this present disclosure typically include a primary glycol ether solvent, an inorganic base, a secondary glycol ether solvent, an amine, and a corrosion inhibitor. In some embodiments, the glycol ether solvents include diethylene glycol butyl ether (DB), diethylene glycol ethyl ether (DE), diethylene glycol methyl ethyl ether (DME), 3-methoxy-3-methyl-1-butanol (MMB), and/or diethylene glycol (DEG). In some embodiments, the inorganic bases include potassium hydroxide (KOH), lithium hydroxide (LiOH) and/or sodium hydroxide (NaOH). In some embodiments, the amines include monoethanolamine (MEA), diethanolamine (DEA), triethanolamine (TEA), diethylenetriamine (DETA), triethylenetetramine (TETA), and/or 2-(2-aminoethoxy)ethanol (AEE) (or combinations thereof). A further embodiment according to this present disclosure contains an additional or tertiary solvent. Suitable tertiary solvents include glycol ethers, polyhydroxyl compounds, and the like. In some embodiments, the compositions are free or essentially free of dimethyl sulfoxide (DMSO) and n-methyl-2-pyrrolidone (NMP). In some embodiments, the composition may be free or essentially free of a sulfur containing solvent. In some embodiments, the composition may be free or essentially free of an amide-containing solvent. In some embodiments, the composition may be free or essentially free of a quaternary ammonium hydroxide. In some embodiments, the composition may be free or essentially free of a tetraalkylammonium hydroxide. In some embodiments, the composition may be free or essentially free of tetramethylammonium hydroxide (TMAH). By essentially free it is meant an amount less than 1 weight %, alternately less than 0.1 weight %, alternately less than 0.01 weight %, or less than 0.001 weight %, or free of, where free of is non-detectable or 0.

In an embodiment, compositions according to this present disclosure include diethylene glycol butyl ether (DB) as the primary solvent, 3-methoxy-3-methyl-1-butanol (MMB) as the secondary solvent, and diethylene glycol as the tertiary solvent, monoethanolamine, potassium hydroxide (KOH), and a corrosion inhibitor. The compositions additionally exhibit improved compatibility with copper, leadfree SnAg solder and epoxy-based molding compounds as well as extended bath life and resistance to precipitation.

In an embodiment, compositions according to this present disclosure include diethylene glycol ethyl ether (DE) as the primary solvent, 3-methoxy-3-methyl-1-butanol as the secondary solvent, potassium hydroxide (KOH), and a corrosion inhibitor. The compositions additionally exhibit improved compatibility with copper, leadfree SnAg solder and epoxy-based molding compounds as well as extended bath life and resistance to precipitation.

In an embodiment, compositions according to this present disclosure include diethylene glycol ethyl ether (DE), an amine, potassium hydroxide (KOH), and a corrosion inhibitor. The compositions additionally exhibit improved compatibility with copper, leadfree SnAg solder and epoxy-based molding compounds as well as extended bath life and resistance to precipitation.

In an embodiment, compositions according to this present disclosure include diethylene glycol ethyl ether (DE) as the primary solvent, 3-methoxy-3-methyl-1-butanol as the secondary solvent, potassium hydroxide (KOH), an amine, and a corrosion inhibitor. The compositions additionally exhibit improved compatibility with copper, leadfree SnAg solder and epoxy-based molding compounds as well as extended bath life and resistance to precipitation.

In some embodiments, the primary solvent may include diethylene glycol butyl ether (DB), diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, 3-methoxy-3-methyl-1-butanol (MMB), diethylene glycol (DEG), or dipropylene glycol. In some embodiments, the primary solvent may be present in an amount from at least about 20 weight %, or at least about 30 weight %, or at least about 40 weight %, or at least about 50 weight %, or at least about 60 weight %, or at least about 65 weight %, and/or less than about 95 weight %, and/or less than about 90 weight %, and/or less than about 85 weight %, and/or less than about 80 weight %, and/or less than about 75 weight % of the composition. In some embodiments, the primary solvent may be present in an amount from about 20 weight % to about 90 weight %, from about 20 weight % to about 80 weight %, from about 20 weight % to about 70 weight %, from about 30 weight % to about 90 weight %, from about 30 weight % to about 80 weight %, from about 30 weight % to about 75 weight %, and/or from about 30 weight % to about 70 weight %, or any weight percent range of the composition defined by any of the following endpoints: 20, 30, 40, 42, 46, 50, 52, 55, 58, 60, 62, 65, 70, 72, 75, 78, 80, 82, 85, 90, 95. The primary solvent provides photoresist dissolution capability for the composition.

In some embodiments, the secondary solvent may include diethylene glycol butyl ether, diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, 3-methoxy-3-methyl-1-butanol (MMB), diethylene glycol (DEG), dipropylene glycol, or propylene glycol (PG). In some embodiments, the secondary solvent is different from the primary solvent. In some embodiments, the secondary solvent may be present in an amount from at least about 5 weight %, or at least about 10 weight %, or at least about 15 weight %, or at least about 20 weight %, and/or less than about 60 weight %, and/or less than about 50 weight %, and/or less than about 40 weight % of the composition. In some embodiments, the secondary solvent may be present in an amount from about 5 weight % to about 60 weight %, or from about 5 weight % to about 50 weight %, or from about 5 weight % to about 45 weight %, or from about 5 weight % to about 40 weight %, or from about 10 weight % to about 60 weight %, or from about 10 weight % to about 50 weight %, or from about 10 weight % to about 45 weight %, and/or from about 10 weight % to about 40 weight % of the composition, or any weight percent range of the composition defined by any of the following endpoints: 2, 5, 8, 10, 12, 15, 18, 20, 25, 28, 30, 35, 38, 40, 42, 45, 46, 50, 52, 55, 58, 60. The secondary solvent may be added to improve stability of the inorganic base to increase bath lifetime, reduce precipitation, aid photoresist removal by improving dissolution characteristics, and/or improve compatibility with materials such as metals, polymeric dielectrics, and epoxy-based molding compounds.

In some embodiments, the compositions may additionally include a tertiary solvent. In one embodiment, the formulations may contain from about 0.1 weight % to about 50 weight % of a tertiary solvent. Particularly useful tertiary solvents include glycol ethers, and polyhydroxyl compounds described in more detail below. In some embodiments, the tertiary solvent includes 3-methoxy-3-methyl-1-butanol (MMB), diethylene glycol (DEG), diethylene glycol methyl ethyl ether (DME) or propylene glycol (PG). The tertiary solvent, when present, is different from the primary solvent and the secondary solvent. The tertiary solvent may be added to improve stability of the potassium carbonate crystals to reduce precipitation.

Particularly suitable formulations have freezing points sufficiently below 0° C. to minimize solidification during transportation and warehousing. More preferred formulations have freezing points below about −10° C., or below about −15° C., or below about −19° C. and a loading capacity of from about 10 cm$^3$/liter up to about 90 cm$^3$/liter. Preferred formulations have flashpoints sufficiently above 85° C. to minimize flammability hazards during use. More preferred formulations have flashpoints above about 90° C., and/or above about 94° C. Because the preferred stripper solutions remain liquid at low temperatures, the need to liquefy solidified drums of stripper solution received during cold weather or stored in unheated warehouses before the solution can be used is eliminated or minimized. The use of drum heaters to melt solidified stripper solution is time consuming, requires extra handling and can result in incomplete melting and modification of the melted solution's composition.

Additionally, compositions according to the present disclosure display high loading capacities enabling the composition to remove higher levels of photoresists without the precipitation of solids. The loading capacity is defined as the number of cm$^3$ of photoresist or bilayer material that can be removed for each liter of stripper solution before material is re-deposited on the wafer or before residue remains on the wafer. For example, if 20 liters of a stripper solution can remove 300 cm$^3$ of photoresist before either redeposition occurs or residue remains on the wafer, the loading capacity is 300 cm$^3$/20 liters=15 cm$^3$/liter. In an embodiment, compositions according to this present disclosure display loading capacities for negative spin-on photoresist of around 10 cm$^3$/liter, of around 13 cm$^3$/liter, of around 15 cm$^3$/liter, of around 17 cm$^3$/liter, of around 19 cm$^3$/liter, and/or of around 21 cm$^3$/liter. In some embodiments, the composition may have a loading capacity for negative spin-on photoresist greater than about 10 cm$^3$/liter, greater than about 13 cm$^3$/liter, greater than about 15 cm$^3$/liter, greater than about 17 cm$^3$/liter, greater than about 19 cm$^3$/liter, and/or greater than about 21 cm$^3$/liter.

The compositions according to the present disclosure may also exhibit resistance to precipitation. As utilized herein, "resistant to precipitation" means the composition according to the present disclosure remains clear or otherwise lacks visible precipitate, including when heated, for example heating to temperatures of 70 degrees Celsius or more, for times of three hours or more.

In an embodiment, the sum of the weight percents of the primary, secondary and/or tertiary solvents in the compositions of this invention may be at least about 50 weight %, or at least about 60 weight %, or at least about 70 weight %, or at least about 75 weight %, or at least about 80 weight %, or at least about 85 weight %, and/or less than about 99.5 weight %, and/or less than about 99 weight %, and/or less than about 95 weight %, and/or less than about 90 weight % of the composition. In an embodiment, the sum of the weight percents of the primary, secondary and/or tertiary solvents in the composition may be from about 50 weight % to about 99.5 weight %, or from about 60 weight % to about 99.5 weight %, or from about 70 weight % to about 99.5 weight %, or from about 75 weight % to about 99.5 weight %, or from about 80 weight % to about 99.5 weight %, or from about 50 weight % to about 98 weight %, from about 60 weight % to about 98 weight %, or from about 70 weight % to about 98 weight %, or from about 75 weight % to about 98 weight %, or from about 80 weight % to about 98 weight %, or from about 50 weight % to about 90 weight %, or from about 60 weight % to about 90 weight %, or from about 70 weight % to about 90 weight %, or from about 75 weight % to about 90 weight %, and/or from about 80 weight % to about 90 weight % of the composition, or any weight percent range of the composition defined by any of the following endpoints: 45, 48, 50, 52, 55, 58, 60, 62, 65, 68, 70, 72, 75, 78, 80, 82, 85, 88, 90, 95, 98, 99 and 99.5.

In some embodiments, the amine may be present in an amount of at least about 1 weight %, or at least about 2 weight %, or at least about 3 weight %, or at least about 4 weight %, or at least about 5 weight %, or at least about 7 weight %, and/or less than about 30 weight %, and/or less than about 25 weight %, and/or less than about 20 weight %, and/or less than about 15 weight %, and/or less than about 10 weight %, based on the total weight of the composition. In an embodiment, the amine may be present in an amount from about 1 weight % to about 30 weight %, or from about 1 weight % to about 25 weight %, or from about 1 weight % to about 20 weight %, or from about 1 weight % to about 15 weight %, or from about 3 weight % to about 30 weight %, or from about 3 weight % to about 25 weight %, or from about 3 weight % to about 20 weight %, or from about 3 weight % to about 15 weight %, from about 5 weight % to about 30 weight %, or from about 5 weight % to about 25 weight %, or from about 5 weight % to about 20 weight %, and/or from about 5 weight % to about 15 weight % of the composition or any weight percent range of the composition defined by any of the following endpoints: 1, 2, 3, 4, 5, 6, 7, 8, 9, 10, 12, 15, 18, 20, 22, 25, 28, 30 and 33.

The primary solvent is present in the composition at equal or greater (preferably greater) weight percents of the stripper composition than the weight percent of either the secondary solvent or tertiary solvent (when present), and the secondary solvent is present at an equal or greater (preferably greater) weight percent than the tertiary solvent, if present. In some embodiments, a ratio of the weight percent of the primary solvent to the weight percent of the secondary solvent in the compositions is greater than about 1, greater than about 1.5, greater than about 2, greater than about 2.5, greater than about 3, or greater than about 3.5. In another embodiment, a ratio of the weight percent of the secondary solvent to weight percent of the amine in the compositions is greater than about 1, greater than about 1.5, greater than about 2, greater than about 2.5, greater than about 3, greater than about 3.5, greater than about 4, greater than about 5, greater than about 6, or greater than about 7.

In some embodiments, the inorganic base may be present in an amount of at least about 0.1 weight %, at least about 0.5 weight %, at least about 1 weight %, at least about 1.5 weight %, and/or less than about 10 weight %, and/or less than about 7 weight %, and/or less than about 5 weight %, and/or less than about 4 weight %, and/or less than about 3 weight %, based on the total weight of the composition. In an embodiment, the inorganic base may be present in an amount of about 0.1 weight % to about 10 weight %, from about 0.1 weight % to about 7 weight %, from about 0.1 weight % to about 3 weight %, from about 1 weight % to about 10 weight %, from about 1 weight % to about 7 weight %, from about 1 weight % to about 5 weight %, from about 1 weight % to about 4 weight %, from about 1 weight % to about 3 weight %, from about 0.5 weight % to about 10 weight %, from about 0.5 weight % to about 7 weight %, from about 0.5 weight % to about 5 weight %, and/or from about 0.5 weight % to about 3 weight % of the composition, or any weight percent range of the composition defined by any of the following endpoints: 0.1, 0.5, 1, 1.5, 2, 3, 4, 5, 6, 7, 8, 9 and 10.

When present, the tertiary solvent may be present in the amount of at least about 0.1 weight %, at least about 0.2 weight %, at least about 0.5 weight %, at least about 1 weight %, at least about 2 weight %, at least about 5 weight %, less than about 50 weight %, less than about 40 weight %, less than about 35 weight %, less than about 30 weight %, less than about 25 weight %, less than about 20 weight % of the composition. In an embodiment, the tertiary solvent may be present in an amount of about 0.1 weight % to about 50 weight %, from about 0.1 weight % to about 40 weight %, from about 0.1 weight % to about 30 weight %, from about 0.1 weight % to about 25 weight %, from about 0.5 weight % to about 50 weight %, from about 0.5 weight % to about 40 weight %, from about 0.5 weight % to about 30 weight %, from about 0.5 weight % to about 25 weight %, from about 1 weight % to about 50 weight %, from about 1 weight % to about 40 weight %, from about 1 weight % to about 30 weight %, and/or from about 1 weight % to about 25 weight % of the composition or any weight percent range of the composition defined by any of the following endpoints: 0.1, 0.2, 0.5, 1, 1.5, 2, 3, 4, 5, 6, 7, 8, 9, 10 and 12, 15, 20, 22, 25, 28, 30, 33, 35, 40, 45 and 50.

In an embodiment, the composition is free or essentially free of a surfactant, a nonionic surfactant, an anionic surfactant, and/or a fluorosurfactant.

When present in the composition of this invention, water may be present in an amount of at least about 0.01 weight %, at least about 0.1 weight %, at least about 0.5 weight %, at least about 1 weight %, less than about 5 weight %, less than about 4 weight %, less than about 3 weight %, less than about 2 weight %, less than about 1 weight %, and/or less than about 0.5 weight % of the composition. In an embodiment, water may be present in the amount from about 0.01 weight % to about 5 weight %, from about 0.01 weight % to about 2 weight %, from about 0.01 to about 1 weight %, from about 0.01 to about 0.5 weight %, from about 0.1 weight % to about 5 weight %, from about 0.1 weight % to about 2 weight %, from about 0.1 weight % to about 1 weight %, or from about 0.1 weight % to about 0.5 weight %. In an embodiment, the composition may be free or essentially free of water. Water may be added to the composition or it may not be added to the composition. Water may be present as an impurity or a stabilizer associated with other components of the composition such as solvents, amines, corrosion inhibitors, or inorganic bases. For example, the inorganic base potassium hydroxide is hygroscopic and often contains water in the form of a hydrate. In an embodiment, the composition may be free or essentially free of added water.

Suitable amines may be alkanolamines that have at least two carbon atoms and have the amino and hydroxyl substituents on different carbon atoms. Suitable alkanolamines include, but are not limited to, ethanolamine, N-methylethanolamine, N-ethylethanolamine, N-propylethanolamine, N-butylethanolamine, dimethylethanolamine, diethylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, 2-(2-aminoethoxy)ethanol, aminoethylethanolamine, 4-(2-hydroxyethyl)morpholine, 1-(2-hydroxyethyl)piperidine, and 1-(2-hydroxyethyl)piperazine or combinations thereof.

Alternatively, suitable amines may be alkyl amines that have one or more nitrogen atoms with a lone pair of electrons that is attached to a non-aryl hydrocarbon. The compound may be linear, branched, or cyclic. Suitable alkyl amines include diethylenetriamine, triethylenetetramine, 1,5-diamino-2-methylpentane, 1,3-diaminopentane, piperazine, 1-(2-am inoethyl)piperazine, 1,2-diaminocyclohexane, 1,3-diaminopropane, 1-(2-aminoethyl)piperidine, and tetraethylenepentamine, or combinations thereof.

The amine may be added to aid photoresist removal by improving dissolution characteristics of the composition. Alkanolamines and/or alkyl amines provide the same benefit. One or more amines may be used in the compositions of this invention, that is any combinations of amines (such as those listed above) may be used.

The tertiary solvent can include a glycol ether, glycol, or a polyhydroxyl compound, or combinations of two or more of these.

The tertiary solvent glycol ethers, and/or polyhydroxyl compounds do not contain (are free of) ester or amine groups. The glycol ether, or polyhydroxyl compounds can be aliphatic, alicyclic, cyclic, or aromatic, but is desirably aliphatic or alicyclic. The glycol ether or polyhydroxyl compound can be saturated or unsaturated, and desirably has one or fewer unsaturated bonds, or no unsaturated bonds. The glycol ether and polyhydroxyl compounds desirably do not contain (are free of) a heteroatom. The glycol ether and polyhydroxyl compounds desirably contain only carbon, oxygen, and hydrogen atoms.

As mentioned above, the tertiary solvent can be a polyhydroxyl compound having two or more hydroxyl groups. The polyhydroxyl compound desirably has a number average molecular weight of no more than 500, or no more than 400, or no more than 350, or no more than 300, or no more than 275, or no more than 250, or no more than 225, or no more than 200, or no more than 175, or no more than 150, or no more than 125, or no more than 100, or no more than 75.

The polyhydroxyl compound can include, ethylene glycol; 1,2-propanediol (propylene glycol); 1,3-propanediol, 1,2,3-propanetriol; 1,2-butanediol; 1,3-propanediol; 2,3-butanediol; 1,4-butanediol; 1,2,3-butanetriol; 1,2,4-butanetriol; 1,2-pentanediol; 1,3-pentanediol; 1,4-pentanediol; 1,5-pentanediol; 2,3-pentanediol; 2,4-pentanediol; 3,4-pentanediol; 1,2,3-pentanetriol; 1,2,4-pentanetriol; 1,2,5-pentanetriol; 1,3,5-pentanetriol; etohexadiol; p-methane-3,8-polyhydroxyl compound; 2-methyl-2,4-pentanediol; 2,2-dimethyl-1,3-propanediol; glycerin; trirnethylolpropane; xylitol; arabitol; 1,2- or 1,3-cyclopentanediol; 1,2- or 1,3-cyclohexanediol; 2,3-norbornanediol; 1,8-octanediol; 1,2-cyclohexane-dimethanol; 1,3-cyclohexanedimethanol; 1,4-cyclohexanedimethanol; 2,2,4-trimethyl-1,3-pentanediol; hydroxypivalyl hydroxypivalate; 2-methyl-1,3-propanediol; 2-butyl-2-ethyl-1,3-propanediol; 2-ethyl-2-isobutyl-1,3-propanediol; 1,6-hexanediol; 2,2,4,4-tetramethyl-1,6-hexanediol; 1,10-decanediol; 1,4-benzenedim ethanol; hydrogenated bisphenol A; 1,1,1-trim ethylol propane; 1,1,1-trimethylolethane; pentaerythritol; erythritol; threitol; dipentaerythritol; sorbitol; glycerol; xylitol; and the like, and combinations of 2 or more of the aforementioned polyhydroxyl compounds and polyhydroxyl compound.

In an illustrative example, the solution can include one or more of the tertiary polyhydroxyl solvents of ethylene glycol, 1,2-propanediol (propylene glycol), 1,3-propanediol, 1,4-pentanediol, 1,5-pentanediol, 1,2-butanediol, 1,4-butanediol, or 1,3-butanediol.

The glycol ether compound as a tertiary solvent can include diethylene glycol butyl ether, diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, 3-methoxy-3-methyl-1-butanol, diethylene glycol, and dipropylene glycol.

The compositions can also optionally contain one or more corrosion inhibitors. Suitable corrosion inhibitors include, but are not limited to, aromatic hydroxyl compounds such as catechol and resorcinol; alkylcatechols such as methylcatechol, ethylcatechol and t-butylcatechol, phenols and pyrogallol; aromatic triazoles such as benzotriazole; alkylbenzotriazoles; sugar alcohols such as glycerol, sorbitol, erythritol, xylitol; carboxylic acids such as formic acid, acetic acid, propionic acid, butyric acid, isobutyric acid, oxalic acid, malonic acid, succinic acid, sebacic acid, dodecanoic acid, undecanoic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; metal salts such as a hydrate of copper (II) nitrate such as copper (II) nitrate hemi(pentahydrate); organic salts of carboxyl containing organic containing compounds described above, basic substances such as ethanolamine, trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime or combinations thereof.

A single corrosion inhibitor may be used, or a combination of corrosion inhibitors may be used. Corrosion inhibitors have proven useful at levels ranging from about 0.0001 weight % (1 ppm) to about 10 weight % of the composition. In some embodiments, the compositions may contain from about 0.0001 weight % to about 7 weight %, from about 0.0001 weight % to about 3 weight %, from about 0.001 weight % to about 10 weight %, from about 0.001 to about 7 weight %, from about 0.001 to about 3 weight %, from about 0.001 weight % to about 2 weight %, from about 0.001 weight % to about 1 weight %, 0.001 weight % to about 0.1 weight %, from about 0.01 weight % to about 7 weight %, from about 0.01 weight % to about 5 weight %, from about 0.01 weight % to about 3 weight %, from about 0.01 weight % to about 2 weight %, from about 0.01 weight % to about 1 weight %, from about 0.05 weight % to about 7 weight %, from about 0.05 weight % to about 5 weight %, from about 0.05 weight % to about 3 weight %, from about 0.05 weight % to about 2 weight %, from about 0.05 weight % to about 1 weight %, from about 0.1 weight % to about 7 weight %, from about 0.1 weight % to about 5 weight %, from about 0.1 weight % to about 3 weight %, from about 0.1 weight % to about 2 weight %, from about 0.1 weight % to about 1 weight %, at least 0.0001 weight %, at least 0.001 weight %, at least 0.01 weight %, at least 0.05 weight %, at least 0.1 weight %, at least 0.5 weight %, less than about 0.05 weight %, less than about 0.1 weight %, less than about 0.5 weight %, less than about 1 weight %, less than about 2 weight %, less than about 3 weight %, less than about 5 weight %, and/or less than about 7 weight % of corrosion inhibitor.

In some embodiments, the solution may contain about 0.001 weight % to about 3 weight % of a first corrosion inhibitor. In an embodiment, the first corrosion inhibitor is a hydrate of copper (II) nitrate. In some embodiments, the solution may additionally contain about 0.05 weight % to about 7 weight % of a second corrosion inhibitor. In other embodiments, the solution may contain about 0.001 weight % to about 2 weight %, about 0.001 weight % to about 1 weight %, 0.001 weight % to about 0.1 weight %, about 0.01 weight % to about 3 weight %, about 0.01 weight % to about 2 weight %, about 0.01 weight % to about 1 weight %, at least 0.001 weight %, at least 0.01 weight %, at least 0.1 weight %, less than about 0.05 weight %, less than about 0.1 weight %, less than about 0.5 weight %, less than about 1 weight %, less than about 2 weight %, and/or less than about 3 weight % of the first corrosion inhibitor. In other embodiments, the solution may contain about 0.05 weight % to about 5 weight %, about 0.05 weight % to about 3 weight %, about 0.05 weight % to about 2 weight %, about 0.05 weight % to about 1 weight %, about 0.1 weight % to about 7 weight %, about 0.1 weight % to about 5 weight %, about 0.1 weight % to about 3 weight %, about 0.1 weight % to about 2 weight %, about 0.1 weight % to about 1 weight %, at least 0.05 weight %, at least 0.1 weight %, at least 1 weight %, less than 1 weight %, less than 2 weight %, less than about 3 weight %, less than about 5 weight %, and/or less than about 7 weight % of the second corrosion inhibitor. The first and second corrosion inhibitors are not the same. Both the first corrosion inhibitor and the second corrosion inhibitor may be selected from the corrosion inhibitors described above. In some embodiments, the composition may be essentially free of a metal salt. In some embodiments, the composition may be essentially free of a sugar alcohol.

Preferred temperatures of at least 50° C. are preferred for contacting the substrate whereas for a majority of applications, temperatures of from about 50° C. to about 80° C. are more preferred. In another embodiment, the preferred temperature is at least 5° C. less than the flashpoint of the solution, or at least 10° C. less than the flashpoint of the solution, or at least 20° C. less than the flashpoint of the solution. Alternatively, the preferred temperature is less than 94° C., or is less than 90° C., or is less than 85° C., or is at least 55° C., or is at least 60° C., or is at least 65° C., or is at least 70° C., or is at least 75° C., or is at least 80° C. In another embodiment, the preferred temperature is from about 60° C. to about 80° C., about 60° C. to about 85° C., about 60° C. to about 90° C., about 60° C. to about 95° C., about 60° C. to about 100° C., about 50° C. to about 85° C., about 50° C. to about 90° C., about 50° C. to about 95° C., and/or about 50° C. to about 100° C. For particular applications where the substrate is either sensitive or longer removal times are required, lower contacting temperatures are appropriate. For example, when reworking substrates, it may be appropriate to maintain the stripper solution at a temperature of at least 20° C. for a longer time to remove the photoresist and avoid damaging to the substrate.

When immersing a substrate, agitation of the composition additionally facilitates photoresist removal. Agitation can be affected by mechanical stirring, circulating, or by bubbling an inert gas through the composition. Upon removal of the desired amount of photoresist, the substrate is removed from contact with the stripper solution and rinsed with water or an alcohol. DI water is a preferred form of water and isopropanol (IPA) is a preferred alcohol. For substrates having components subject to oxidation, rinsing is preferably done under an inert atmosphere. The preferred stripper solutions according to the present disclosure have improved loading capacities for photoresist materials compared to current commercial products and are able to process a larger number of substrates with a given volume of stripper solution.

The stripper solutions provided in this disclosure can be used to remove polymeric resist materials present in a single layer or certain types of bilayer resists. For example, bilayer resists typically have either a first inorganic layer covered by a second polymeric layer or can have two polymeric layers. Utilizing the methods taught below, a single layer of polymeric resist can be effectively removed from a standard wafer having a single polymer layer. The same methods can also be used to remove a single polymer layer from a wafer having a bilayer composed of a first inorganic layer and a second or outer polymer layer. Finally, two polymer layers can be effectively removed from a wafer having a bilayer composed of two polymeric layers using the stripper composition and/or method of this invention.

This disclosure describes chemical solutions used for removal of thick photoresist in advanced packaging applications for semiconductor devices. In one embodiment, the solutions described contain diethylene glycol butyl ether (DB), inorganic base, amine, secondary solvent, and at least one corrosion inhibitor. In some embodiments, the solution is essentially free of DMSO and NMP. In some embodiments the solution is free or essentially free of a quaternary ammonium hydroxide. In some embodiments the solution is free or essentially free of alcohols with boiling points of at least 100° C. In some embodiments the amine is monoethanolamine, diethylenetriamine, triethylenetetramine, and/or 2-(2-aminoethoxy)ethanol. In some embodiments the secondary solvent is 3-methyl-3-methoxy-1-butanol or diethylene glycol. By essentially free it is meant an amount less than 1 weight %, alternately less than 0.1 weight %, alternately less than 0.01 weight % or less than 0.001 weight %. Essentially free of also includes free of which is no quaternary ammonium hydroxide present. The solutions typically contain less than about 5 weight % water.

Some embodiments of the compositions of the invention may be essentially free of, alternatively free of (as those terms were defined earlier) alcohols with boiling points of at least 100° C., where alcohols have the general chemical formula of R—OH where R is a $C_4$-$C_{30}$ hydrocarbon group, such as benzyl alcohol and 2-ethyl hexanol.

Some embodiments of the compositions of the invention may be essentially free of, alternatively free of (as those terms were defined earlier) one or more than one of the following in any combination: polar aprotic solvents, sulfur-containing compounds, nitrogen containing solvents such as amides, propylene glycol methyl ether acetate, glycol ether acetate solvents, oxoammonium compounds, hydroxylamine and derivatives thereof, hydrogen peroxide, oxidants, inorganic acids, organic acids, pyrazole, non-alkaline metal hydroxides, glycols, polyols, NMP, DMSO, dimethylacetamide, fluorine-containing compounds, phosphorous-containing compounds, dimethylformamide, dimethylsulfone, lactone solvents, gamma-butyrolactone, ethylene glycol, propylene glycol, tetrahydrofurfuryl alcohol, furfuryl alcohol, glycerine, quaternary ammonium hydroxides, tetraalkylammoium hydroxides, tetramethylammonium hydroxide, tetraethylammonium hydroxide, surfactants, potassium carbonate, metal-containing compounds, sugar alcohols, triazole and triazole derivatives, benzotriazole, and aromatic hydroxyl compounds.

EXAMPLES

The following abbreviations are used in the various compositions listed below: DB=diethylene glycol butyl ether; DEG=diethylene glycol; MEA=monoethanolamine; DETA=diethylenetriamine; TETA=triethylenetetramine; MMB=3-methoxy 3-methyl-1-butanol; KOH=potassium hydroxide; NMP=n-methyl-2-pyrrolidone; DE=diethylene glycol ethyl ether; AEE=2-(2-aminoethoxy)ethanol; DME=diethylene glycol methyl ethyl ether.

In the following examples, photoresist removal was performed using an immersion process in a beaker. For the immersion process, coupon-sized samples of semiconductor wafers were processed in beakers. Beakers were filled with 100 mL of a stripping composition and heated to the target temperature of 70° C. When the stripping composition was at the target temperature, a coupon was placed in a holder in the beaker, and slight agitation was provided by a stir bar. Temperature was maintained at the target temperature of 70° C. throughout the process. After a total processing time of 15 minutes, the coupons were removed from the beaker, rinsed with DI water and IPA, and dried with a stream of air.

Table 1 lists various inventive and comparative stripping compositions.

(All percentages are weight %, based on the total weight of the formulation)

TABLE 1

| Formulations | | |
|---|---|---|
| Formulation 1 | Formulation 2 | Formulation 3 |
| 64.975% DB solvent | 1.8% KOH | 1.8% KOH |
| 20.0% MMB | 18% MEA | 3% DETA |
| 8.0% MEA | 40% MMB | 20% MMB |
| 5.0% DEG | 39.975% DEG | 10% DEG |
| 1.8% KOH | 0.215% water | 0.215% water |
| 0.215% water | 0.01% copper (II) nitrate | 0.01% copper (II) nitrate |
| 0.01% copper (II) nitrate | | 64.975% DB solvent |

| Formulation 4 | Formulation 5 | Formulation 6 | Formulation 7 | Formulation 8 |
|---|---|---|---|---|
| 80% DEG | 80% DB solvent | 80% DEG | 80% DB solvent | 40% DEG |
| 18% MEA | 18% MEA | 18% MEA | 18% MEA | 18% MEA |
| 1.8% KOH | 1.8% KOH | 1.8% KOH | 1.8% KOH | 1.8% KOH |
| 0.2% water | 0.2% water | 20% MMB | 20% MMB | 40% MMB |
| | | 0.2% water | 0.2% water | 0.2% water |

| Formulation 9 | Formulation 10 | Formulation 11 | Formulation 12 | Formulation 13 | Formulation 14 |
|---|---|---|---|---|---|
| 49.975% DB solvent | 52.975% DB solvent | 52.975% DB solvent | 37.975% DB solvent | 33.475% DB solvent | |
| 1.8% KOH | 1.8% KOH | 1.8% KOH | 1.8% KOH | 1.35% KOH | 1.8% KOH |
| 20% MMB | 20% MMB | 20% MMB | 40% MMB | 35% MMB | 20% MMB |
| 20% DEG | 20% DEG | 20% DEG | 20% DEG | 20% DEG | 67.975% DEG |
| 10% DETA | 5% DETA | 5% TETA | | 10% DETA | 10% DETA |
| 0.215% water | 0.215% water | 0.215% water | 0.215% water | 0.01% copper (II) nitrate | 0.215% water |
| 0.01% copper (II) nitrate | 0.01% copper (II) nitrate | 0.01% copper (II) nitrate | 0.01% copper (II) nitrate | 0.0165% water | 0.01% copper (II) nitrate |

| Formulation 15 | Formulation 16 | Formulation 17 | Formulation 18 | Formulation 19 |
|---|---|---|---|---|
| 67.975% DB solvent | 62.975% DB solvent | 67.475% DB solvent | 67.725% DB solvent | 67.975% DB solvent |
| 1.8% KOH | 1.8% KOH | 1.8% KOH | 1.8% KOH | 1.8% KOH |
| 20% MMB | 20% MMB | 20% MMB | 20% MMB | 20% MMB |
| 10% DETA | 10% DETA | 10% DETA | 10% DETA | |
| | 5% DEG | 0.5% glycerine | 0.25% glycerine | 10% DEG |
| 0.215% water | 0.215% water | 0.215% water | 0.215% water | 0.215% water |
| 0.01% copper (II) nitrate | 0.01% copper (II) nitrate | 0.01% copper (II) nitrate | 0.01% copper (II) nitrate | 0.01% copper (II) nitrate |

TABLE 1-continued

| Formulations | | | |
|---|---|---|---|
| Formulation 20 | Formulation 21 | Formulation 22 | Formulation 23 |
| 69.975% DB solvent<br>1.8% KOH<br>8% MEA<br>20% MMB<br>0.215% water<br>0.01% copper (II) nitrate | 49.975% DB solvent<br>1.8% KOH<br>8% MEA<br>40% MMB<br>0.215% water<br>0.01% copper (II) nitrate | 47.975% DB solvent<br>1.8% KOH<br>5% MEA<br>40% MMB<br>5% DEG<br>0.215% water<br>0.01% copper (II) nitrate | 44.975% DB solvent<br>1.8% KOH<br>8% MEA<br>40% MMB<br>5% DEG<br>0.215% water<br>0.01% copper (II) nitrate |
| Formulation 24 | Formulation 25 | Formulation 26 | Formulation 27 |
| 57.975% DE solvent<br>1.8% KOH<br>20% DME<br>20% MMB<br>0.215% water<br>0.01% copper (II) nitrate | 79.975% DE solvent<br>1.8% KOH<br>18% AEE<br>0.215% water<br>0.01% copper (II) nitrate | 69.975% DE solvent<br>1.8% KOH<br>18% AEE<br>10% MMB<br>0.215% water<br>0.01% copper (II) nitrate | 76% DE solvent<br>1.8% KOH<br>20% MMB<br>2% DEG<br>0.2% water |
| Formulation 28 | Formulation 29 | Formulation 30 | Formulation 31 |
| 77% DE solvent<br>1.8% KOH<br>20% MMB<br>1% DEG<br>0.2% water | 77.5% DE solvent<br>1.8% KOH<br>20% MMB<br>0.5% DEG<br>0.2% water | 66.175% DB solvent<br>1.6% KOH<br>7% MEA<br>20% MMB<br>5% DEG<br>0.215% water<br>0.01% copper (II) nitrate | 65.925% DB solvent<br>1.6% KOH<br>7% MEA<br>20% MMB<br>5% DEG<br>0.215% water<br>0.01% copper (II) nitrate<br>0.25% sorbitol |
| Formulation 32 | Formulation 33 | Formulation 34 | Formulation 35 |
| 65.925% DB solvent<br>1.6% KOH<br>7% MEA<br>20% MMB<br>5% DEG<br>0.215% water<br>0.01% copper (II) nitrate<br>0.25% xylitol | 65.925% DB solvent<br>1.6% KOH<br>7% MEA<br>20% MMB<br>5% DEG<br>0.215% water<br>0.01% copper (II) nitrate<br>0.25% resorcinol | 65.675% DB solvent<br>1.6% KOH<br>7% MEA<br>20% MMB<br>5% DEG<br>0.215% water<br>0.01% copper (II) nitrate<br>0.5% glycerol | 55.575% DB solvent<br>1.6% KOH<br>37.6% MMB<br>5% DEG<br>0.5% glycerol<br>0.215% water<br>0.01% copper (II) nitrate |
| Comparative Formulation 1 | | | |
| 83.14% MMB<br>10% NMP<br>5% phenol ethoxylate surfactant<br>1.674% KOH<br>0.186% water | | | |

Example 1

Table 2 lists stripping compositions that were tested for Example 1 using the immersion process and semiconductor wafers with 60 μm-70 μm thick JSR THB-151N negative spin-on photoresist with plated Cu pillars or micro bumps and Sn/Ag solder caps. The process temperature for all compositions in Table 2 was 70° C., respectively.

For the experiments described below, resist removal was observed and noted accordingly. Resist removal is defined as "clean" if all resist was removed from the wafer coupon surface; as "mostly clean" if at least 95% of the resist, but not all of the resist, was removed from the surface; and "partly clean" if at least about 80% of the resist, but less than 95% of the resist, was removed from the surface. In general, higher concentrations of amine resulted in better resist removal performance.

TABLE 2

| Formulation | Resist removal for Cu pillar wafer @ 60 min | Resist removal for micro bump wafer @ 15 min |
|---|---|---|
| 1 | clean | Not tested |
| 2 | Not tested | Clean |
| 3 | Not tested | Mostly clean |
| 4 | Not tested | Clean |
| 5 | Not tested | Clean, Cu oxidation |
| 8 | Not tested | Clean |
| 15 | Not tested | Clean, solder attack |

TABLE 2-continued

| Formulation | Resist removal for Cu pillar wafer @ 60 min | Resist removal for micro bump wafer @15 min |
|---|---|---|
| 16 | Not tested | clean |
| 17 | Not tested | clean |
| 18 | Not tested | clean |
| 19 | Not tested | Partially clean |
| 20 | clean | Not tested |
| 21 | clean | Not tested |
| 22 | Partially clean | Not tested |
| 23 | clean | Not tested |

Example 2

In Example 2, various stripping compositions were used to remove 50 μm thick JSR THB-164N negative spin-on photoresist from a silicon wafer plated with Cu pillar features and Sn/Ag solder caps. Resist removal was performed using an immersion process. For the immersion process, coupon-sized samples of semiconductor wafers were processed in beakers. Beakers were filled with 100 mL of a stripping composition and heated to the target temperature of 70° C. When the stripping composition was at the target temperature, a coupon was placed in a holder in the beaker, and slight agitation was provided by a stir bar. Temperature was maintained at the target temperature of 70° C. throughout the process. After a total processing time of 15 minutes, the coupons were removed from the beaker, rinsed with DI water and IPA, and dried with a stream of air.

For the experiments described below, resist removal was observed and noted accordingly. Resist removal is defined as "clean" if all resist was removed from the wafer coupon surface; as "mostly clean" if at least 95% of the resist was removed from the surface; "partly clean" if about 80% of the resist was removed from the surface.

Table 3 lists stripping compositions that were tested for Example 2 using the immersion process and semiconductor wafers with thick spin on photoresist with plated Cu features and Sn/Ag solder caps. The heating temperature in Table 3 was 70° C. In general, higher concentrations of amine resulted in better resist removal performance.

TABLE 3

| Formulation | Resist removal for Cu pillar wafer @ 60 min |
|---|---|
| 2 | clean |
| 9 | clean |
| 11 | Partially clean |
| 12 | Partially clean |
| 13 | clean |
| 15 | clean |
| 16 | clean |
| 17 | clean |
| 18 | clean |
| 27 | Mostly clean |
| 28 | Clean |
| 29 | Clean |

Example 3

In the Example 3, various stripping compositions were heated on hotplate at 70° C. or 85° C. for a few hours with watch glass covering it up. KOH was titrated before and after heating to monitor strong base drop from initial per hour.

Table 4 lists stripping compositions that were tested for Example 3. The heating temperature in Table 4 was 70° C. or 85° C. A smaller decrease in KOH is preferred. In general, higher concentrations of MMB resulted in smaller decreases in KOH.

TABLE 4

| Formulation | Temperature ° C. | % Decrease from initial KOH concentration |
|---|---|---|
| Comparative Ex. 1 | 85 | 1.5% |
| 1 | 70 | 0.9% |
| 2 | 70 | 1.31% |
| 3 | 70 | 2.0% |
| 4 | 70 | 2.7% |
| 6 | 70 | 1.8% |
| 7 | 70 | 4.9% |
| 8 | 70 | 1.38% |
| 15 | 70 | 1.8% |
| 16 | 70 | 3.6% |
| 17 | 70 | 3.7% |
| 18 | 70 | 4.2% |
| 20 | 70 | 1.9% |
| 21 | 70 | 1.7% |
| 22 | 70 | 1.3% |
| 23 | 70 | 1.5% |

Example 4

In the Example 4, various stripping compositions were used to check compatibility with epoxy molding compounds at 70° C. or 85° C. for 30 min, 60 min and 90 min. Weight loss was monitored to verify the compatibility. Less weight loss is preferred. In general, higher concentrations of DEG resulted in more weight loss of the molding compound.

Table 5 lists stripping compositions that were tested for Example 4. The heating temperature in Table 5 was 70° C. or 85° C.

TABLE 5

| Formulation | Temperature (° C.) | Time (min) | Weight loss |
|---|---|---|---|
| Comparative Ex. 1 | 85 | 30 | 10.9% |
| | 85 | 60 | 16.3% |
| | 85 | 90 | 17.0% |
| 1 | 70 | 30 | 4.8% |
| | 70 | 60 | 6.5% |
| | 70 | 90 | 4.6% |
| 2 | 70 | 30 | 5.5% |
| | 70 | 60 | 13.1% |
| | 70 | 90 | 18.3% |
| 3 | 70 | 30 | 1.1% |
| | 70 | 60 | 1.9% |
| | 70 | 90 | 0.7% |
| 9 | 70 | 60 | 4.3% |
| | 70 | 90 | 5.8% |
| 10 | 70 | 60 | 1.5% |
| | 70 | 90 | 15.4% |
| 11 | 70 | 60 | 4.4% |
| | 70 | 90 | 10.4% |
| 12 | 70 | 60 | 13.1% |
| | 70 | 90 | 5.1% |
| 13 | 70 | 60 | 9.2% |
| | 70 | 90 | 6.5% |
| 14 | 70 | 60 | 9.2% |
| | 70 | 90 | 12.2% |
| 15 | 70 | 30 | 5.4% |
| | 70 | 60 | 6.8% |
| | 70 | 90 | 7.6% |
| 16 | 70 | 60 | 12.1% |
| | 70 | 90 | 6.5% |

TABLE 5-continued

| Formulation | Temperature (° C.) | Time (min) | Weight loss |
|---|---|---|---|
| 20 | 70 | 30 | 7.7% |
|  | 70 | 60 | 6.4% |
|  | 70 | 90 | 11.6% |
| 21 | 70 | 30 | 6.4% |
|  | 70 | 60 | 4.3% |
|  | 70 | 90 | 6.0% |
| 22 | 70 | 30 | 6.4% |
|  | 70 | 60 | 7.6% |
|  | 70 | 90 | 4.2% |
| 23 | 70 | 30 | 1.7% |
|  | 70 | 60 | 7.5% |
|  | 70 | 90 | 2.8% |

Example 5

In the Example 5, various stripping compositions were used and were heated on hotplate at 70° C. for about 3 hours with watch glass covering the beaker. Solution clarity and precipitate formation were visually checked to monitor crystallization. For the experiments described below, crystallization is described as "none" is the solution remained clear and no crystallization or precipitation of solids was observed. Crystallization is described as "low" if the solution turned cloudy but no crystallization or solid precipitation was observed. Crystallization is described as "medium" if the solution turned cloudy and a small amount of crystallization on the beaker sidewall or solid precipitation was observed. Crystallization is described as "high" if the solution turned cloudy and a large amount of solid precipitation was observed in the bottom of the beaker. In general, higher concentrations of DEG resulted in less precipitation of solids.

Table 6 lists stripping compositions that were tested for Example 5. The heating temperature in Table 6 was 70° C.

TABLE 6

| Formulation | Temperature ° C. | Crystallization |
|---|---|---|
| 1 | 70 | Low |
| 2 | 70 | None |
| 3 | 70 | Low |
| 4 | 70 | None |
| 5 | 70 | Medium |
| 6 | 70 | High |
| 7 | 70 | None |
| 8 | 70 | None |
| 9 | 70 | None |
| 10 | 70 | None |
| 11 | 70 | None |
| 12 | 70 | Low |
| 13 | 70 | None |
| 14 | 70 | None |
| 15 | 70 | Medium |
| 16 | 70 | Medium |
| 17 | 70 | Medium |
| 18 | 70 | Medium |
| 20 | 70 | High |
| 21 | 70 | High |
| 22 | 70 | Medium |
| 23 | 70 | Medium |
| 24 | 70 | None |
| 25 | 70 | Low |
| 26 | 70 | Low |
| 27 | 70 | Low |
| 28 | 70 | Low |
| 29 | 70 | Low |

Example 6

In Example 6, various stripping compositions were used to determine the resist loading capacity for removal of 60 μm thick JSR THB-164N negative spin-on photoresist from a silicon wafer plated with Cu pillar features and Sn/Ag solder caps. Resist removal was performed using an immersion process. For the immersion process, coupon-sized samples of semiconductor wafers were processed in beakers. Beakers were filled with 100 mL of a stripping composition and heated to the corresponding target temperature for each composition that was tested. When the stripping composition was at the target temperature, multiple coupons were placed in a holder in the beaker, and slight agitation was provided by a stir bar. Temperature was maintained at the target temperature throughout the process. After total processing time of 50-60 minutes, the coupons were removed from the beaker, rinsed with DI water and IPA, and dried with a stream of air. Experiments were repeated with multiple coupons. Coupons were inspected for resist removal until incomplete resist removal was observed. The resist loading capacity was determined by adding the surface area for all of the coupons where the photoresist was completely removed multiplied by the 60 μm thickness of the photoresist to calculate the volume of photoresist removed. The total volume of photoresist that was removed was divided by 100 mL to calculate the resist loading capacity, and the value was converted to $cm^3$/liter.

Table 7 lists stripping compositions that were tested for Example 6 and their corresponding photoresist loading capacity.

TABLE 7

| Formulation | Temperature ° C. | Time | Loading Capacity |
|---|---|---|---|
| 1 | 80 | 50 min | 21.4 $cm^3$/liter |
| 2 | 70 | 60 min | 17.3 $cm^3$/liter |
| Comparative Ex. 1 | 85 | 50 min | 17.6 $cm^3$/liter |

Example 7

Table 8 lists the flash point of various formulations.

TABLE 8

| Flashpoints | |
|---|---|
| Formulation | Flashpoint (° C.) |
| 1 | 94.5 |
| Comparative Ex. 1 | 81 |

While the invention has been described with reference to one or more embodiments, it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A stripper solution for removing photoresist from substrates comprising:
   about 20 weight % to about 90 weight % primary solvent;
   about 5 weight % to about 50 weight % of a secondary solvent;
   about 1 weight % to about 7 weight % of an inorganic base;
   about 1 weight % to about 30 weight % of an amine;
   a corrosion inhibitor comprising about 0.0001 weight % to about 10 weight % of copper (II) nitrate hemi (pentahydrate);
   wherein the solution exhibits a flash point above about 90 degrees Celsius; and
   wherein the solution is essentially free of a quaternary ammonium hydroxide.

2. The stripper solution of claim 1, wherein said primary solvent is diethylene glycol butyl ether, or diethylene glycol ethyl ether.

3. The solution of claim 1, wherein the inorganic base is present in an amount from about 1 weight % to about 4 weight %.

4. The solution of claim 3, wherein the inorganic base comprises potassium hydroxide.

5. The solution of claim 1, further comprising from about 0.1 weight % to about 5 weight % water.

6. The solution of claim 1, wherein the amine is present in the amount of about 1 weight % to about 20 weight %.

7. The solution of claim 1, further comprising a tertiary solvent, wherein the sum of the amount of the primary, secondary, and tertiary solvents is about 50 weight % to about 99.5 weight %.

8. The solution of claim 1, wherein the amine comprises monoethanolamine, diethanolamine, triethanolamine, diethylenetriamine, triethylenetetramine, or 2-(2-aminoethoxy) ethanol, or combinations thereof.

9. The solution of claim 1, wherein the primary solvent is diethylene glycol butyl ether and is present in the amount of about 20 weight % to about 80 weight %;
   wherein the inorganic base is present in the amount of about 1 weight % to about 3 weight %;
   wherein the amine is present in the amount of about 3 weight % to about 20 weight %; and
   wherein corrosion inhibitor is present in the amount of about 0.001 weight % to about 1 weight %.

10. The solution of claim 9, wherein the amine comprises monoethanolamine, diethanolamine, triethanolamine, diethylenetriamine, triethylenetetramine, or 2-(2-aminoethoxy) ethanol or combinations thereof.

11. The solution of claim 1, further comprising one or more of resorcinol, glycerol, xylitol and sorbitol.

12. The solution of claim 11, wherein the corrosion inhibitor is present in an amount from about 0.001 weight % to about 0.1 weight %.

13. The solution of claim 11, wherein the corrosion inhibitor is present in an amount from about 0.001 weight % to about 3 weight %.

14. The solution of claim 1, wherein the solution is essentially free of a sulfur containing solvent.

15. The solution of claim 1, wherein the solution is essentially free of an alcohol with a boiling point of at least 100° C.

16. The stripper solution of claim 1, wherein
   said primary solvent is diethylene glycol butyl ether, diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, diethylene glycol diethyl ether, 3-methyl-3-methoxy-1-butanol, diethylene glycol, or dipropylene glycol;
   said secondary solvent is diethylene glycol methyl ether, diethylene glycol ethyl ether, diethylene glycol propyl ether, propylene glycol methyl ether, dipropylene glycol methyl ether, propylene glycol propyl ether, dipropylene glycol propyl ether, propylene glycol phenyl ether, propylene glycol n-butyl ether, dipropylene glycol n-butyl ether, ethylene glycol propyl ether, ethylene glycol butyl ether, ethylene glycol phenyl ether, tripropylene glycol methyl ether, dipropylene glycol dimethyl ether, diethylene glycol methyl ethyl ether, diethylene glycol dimethyl ether, and diethylene glycol diethyl ether, 3-methyl-3-methoxy-1-butanol, diethylene glycol, dipropylene glycol or propylene glycol;
   said inorganic base comprises potassium hydroxide;
   said amine comprises monoethanolamine, diethanolamine, triethanolamine, diethylenetriamine, triethylenetetramine, or 2-(2-aminoethoxy)ethanol, or combinations thereof;
   further comprising an additional corrosion inhibitor comprising about 0.001 weight % to about 3 weight % of resorcinol, glycerol, xylitol, sorbitol, or a hydrate of copper (II) nitrate, or combinations thereof;
   wherein the primary solvent and the secondary solvent are different; and
   wherein the solution is essentially free of an alcohol with a boiling point of at least 100° C.

17. The solution of claim 16, wherein the secondary solvent is selected from the group consisting of 3-methyl-3-methoxy-1-butanol, diethylene glycol, and diethylene glycol methyl ethyl ether.

18. The solution of claim 16, wherein the potassium hydroxide is present in the amount of about 1 weight % to about 3 weight %;
   wherein the amine is present in the amount of about 3 weight % to about 20 weight %; and
   wherein the corrosion inhibitor is present in the amount of about 0.001 weight % to about 1 weight %.

19. The solution of claim 16, wherein the sum of the weight percents of the primary solvent and the weight % of the secondary solvent is between about 50 weight % and 99.5 weight %, based on the total weight of the composition.

20. The method of cleaning a substrate comprising the step of:
   immersing a substrate into a solution comprising the stripper solution of claim 1.

21. The stripper solution of claim 1, wherein the solution is free of a surfactant.

22. A stripper solution for removing photoresist from substrates comprising:
   about 20 weight % to about 90 weight % primary solvent comprising diethylene glycol butyl ether;
   about 5 weight % to about 50 weight % of a secondary solvent;
   about 1 weight % to about 7 weight % of an inorganic base;

about 1 weight % to about 30 weight % of an amine comprising diethylenetriamine, triethylenetetramine or combinations thereof;

about 0.0001 weight % to about 10 weight % of copper (II) nitrate hemi(pentahydrate);

wherein the solution exhibits a flash point above about 90 degrees Celsius; and wherein the solution is essentially free of a quaternary ammonium hydroxide; and wherein the solution is free of a surfactant.

\* \* \* \* \*